United States Patent
Adib et al.

(10) Patent No.: US 10,548,234 B2
(45) Date of Patent: Jan. 28, 2020

(54) ULTRAVIOLET LIGHT-RESISTANT ARTICLES AND METHODS FOR MAKING THE SAME

(71) Applicant: CORNING INCORPORATED, Corning, NY (US)

(72) Inventors: Kaveh Adib, Corning, NY (US); Robert Alan Bellman, Painted Post, NY (US); Andrea Weiss Bookbinder, Corning, NY (US); Shandon Dee Hart, Corning, NY (US); Albert Peter Heberle, Painted Post, NY (US); Karl William Koch, III, Elmira, NY (US); Lin Lin, Painted Post, NY (US); Charles Andrew Paulson, Painted Post, NY (US); Vitor Marino Schneider, Painted Post, NY (US)

(73) Assignee: CORNING INCORPORATED, Corning, NY (US)

(*) Notice: Subject to any disclaimer, the term of this patent is extended or adjusted under 35 U.S.C. 154(b) by 242 days.

(21) Appl. No.: 15/297,329

(22) Filed: Oct. 19, 2016

(65) Prior Publication Data
US 2017/0118855 A1 Apr. 27, 2017

Related U.S. Application Data

(60) Provisional application No. 62/244,816, filed on Oct. 22, 2015.

(51) Int. Cl.
*H05K 5/03* (2006.01)
*H04B 1/3888* (2015.01)
(Continued)

(52) U.S. Cl.
CPC ............ *H05K 5/03* (2013.01); *C23C 14/0036* (2013.01); *C23C 14/024* (2013.01); *C23C 14/28* (2013.01);
(Continued)

(58) Field of Classification Search
None
See application file for complete search history.

(56) References Cited

U.S. PATENT DOCUMENTS 3,850,787 A 11/1974 Robinson et al.
3,961,930 A 6/1976 Robinson et al.
(Continued)

OTHER PUBLICATIONS

RefractiveIndex.Info: https://refractiveindex.info/?shelf=main&book=Si3N4&page=Philipp (Year: 2008).*
(Continued)

*Primary Examiner* — David Sample
*Assistant Examiner* — Nicole T Gugliotta
(74) *Attorney, Agent, or Firm* — Kevin M. Johnson

(57) ABSTRACT

An ultraviolet light-resistant article that includes: a substrate having a glass or glass-ceramic composition and first and second primary surfaces; an ultraviolet light-absorbing element having a an absorptivity greater than 50% at wavelengths from about 100 nm to about 380 nm and a thickness between about 10 nm and about 100 nm; and a dielectric stack formed with a plasma-enhanced process. Further, the light-absorbing element is between the substrate and the dielectric stack. Alternatively, the light-absorbing element can include one or more ultraviolet light-resistant layers disposed within the dielectric stack over the first primary surface.

13 Claims, 10 Drawing Sheets

(51) Int. Cl.
| | |
|---|---|
| C03C 17/34 | (2006.01) |
| C23C 28/04 | (2006.01) |
| C23C 16/40 | (2006.01) |
| C23C 14/08 | (2006.01) |
| C03C 17/23 | (2006.01) |
| C23C 16/50 | (2006.01) |
| C23C 16/02 | (2006.01) |
| C23C 16/56 | (2006.01) |
| C23C 14/28 | (2006.01) |
| H01J 37/32 | (2006.01) |
| C23C 14/58 | (2006.01) |
| C23C 14/02 | (2006.01) |
| C23C 14/00 | (2006.01) |
| C23C 14/34 | (2006.01) |
| H05K 5/00 | (2006.01) |
| H04M 1/02 | (2006.01) |

(52) U.S. Cl.
CPC .......... *C23C 14/34* (2013.01); *C23C 14/5806* (2013.01); *C23C 16/0272* (2013.01); *C23C 16/50* (2013.01); *C23C 16/56* (2013.01); *H01J 37/32* (2013.01); *H04B 1/3888* (2013.01); *H04M 1/0266* (2013.01); *H05K 5/0017* (2013.01); *H01J 2237/3321* (2013.01)

(56) References Cited

U.S. PATENT DOCUMENTS

| | | |
|---|---|---|
| 4,287,380 A | 9/1981 | Fairbanks et al. |
| 4,429,402 A | 1/1984 | Carley |
| 4,433,419 A | 2/1984 | Williamson |
| 4,862,477 A | 8/1989 | Olds et al. |
| 5,151,918 A | 9/1992 | Argent et al. |
| 5,876,854 A | 3/1999 | Kawazu et al. |
| 6,337,124 B1 | 1/2002 | Anderson et al. |
| 2001/0002295 A1* | 5/2001 | Anderson ......... B32B 17/10036 428/432 |
| 2013/0223807 A1 | 8/2013 | Elford et al. |
| 2015/0015959 A1 | 1/2015 | Lee et al. |
| 2015/0232380 A1 | 8/2015 | Bookbinder et al. |

OTHER PUBLICATIONS

Kijaszek et al., "Investigation of optical properties of silicon oxynitride films deposited by RF PECVD method," Materials Science—Poland, 34(4), pp. 868-871 (Year: 2016).*

Encyclopaedia Britannica: https://www.britannica.com/technology/soda-lime-glass (Year: 2018).*

Oliver, W.C.; Pharr, G. M. An improved technique for determining hardness and elastic modulus using load and displacement sensing indentation experiments. J. Mater. Res., vol. 7, No. 6, 1992, 1564-1583.

Oliver, W.C.; Pharr, G.M. Measurement of Hardness and Elastic Modulus by Instrument Indentation: Advances in Understanding and Refinements to Methodology. J. Mater. Res., vol. 19, No. 1, 2004, 3-20.

http://www.fhwa.dot.gov/publications/research/infrastructure/pavements/ltpp/99147/99147a.pdf, sections 2.4 and 3.0, downloaded Jan. 12, 2017.

http://www.utexas.edu/research/ctr/pdf_reports/0_4061_P3.pdf table land p. 5, downloaded Jan. 12, 2017.

International Search Report and Written Opinion PCT/US2016/058034 dated Jan. 10, 2017.

* cited by examiner

ULTRAVIOLET LIGHT-RESISTANT ARTICLES AND METHODS FOR MAKING THE SAME

CROSS-REFERENCE TO RELATED APPLICATIONS

This application claims the benefit of priority under 35 U.S.C. § 119 of U.S. Provisional Application Ser. No. 62/244,816 filed on Oct. 22, 2015, the content of which is relied upon and incorporated herein by reference in its entirety.

TECHNICAL FIELD

The present disclosure relates generally to ultraviolet (UV) light protection for glass and glass-ceramic articles. More particularly, the various embodiments described herein relate to glass and glass-ceramic articles having structures configured to provide protection from negative effects (e.g., discoloration) associated with UV-related processing (e.g., plasma-enhanced coating deposition).

BACKGROUND

Glass and glass-ceramic substrates used in consumer products may have several different intrinsic properties of interest. In certain applications, the mechanical properties of the substrate are particularly important. The optical properties of the substrate gain importance in other applications. In most applications, the substrate is configured with a combination of suitable properties that encompass mechanical, optical, thermal, and many other desirable attributes.

In certain development programs, including some display device applications, a standard set of glass and glass-ceramic materials can be employed as a starting point for a substrate. This set of materials may have an established set of mechanical properties. Accordingly, development work can emphasize the refinement of the optical properties of the substrates with the needs of the application in mind. For example, efforts may be made to enhance optical loss, optical reflectivity, transmission and color perception associated with these substrates under certain illuminations.

Coatings deposited or otherwise formed on the substrates are often optimized and configured to change and enhance the optical properties associated with the substrates. Some coatings can be quite simple using a single layer of a certain material, while some other coatings can be quite complex with hundreds of layers of a few materials. Regardless of the coating design and number of layers, it is generally expected that the substrate properties (e.g., optical transmissivity in the visible wavelengths, color perception, etc.) should not appreciably change during or after the coating deposition process. The reasoning behind this assumption is that in the design process one needs to know the substrate parameters and material parameters well in order to target the desired outcome for the particular application.

In other development programs, an application may require particular optical properties associated with a glass or glass-ceramic substrate (e.g., extremely high optical transmittance and extremely low color changes) with an extremely thick protective coating (e.g., a scratch-resistant layer) that cannot be currently obtained with known material systems and processes. That is, known approaches to providing a large increase in substrate durability through secondary coatings often result in a trade-off in loss of certain substrate optical properties.

More generally, certain glass and glass-ceramic substrates can experience optical property changes associated with secondary processing. For example, secondary processing in the form of ultraviolet light-assisted coating deposition process can break and otherwise reorganize silicate bonds in the underlying glass and glass-ceramic substrate. These bond structure changes affect the glass network and its refractive index. Further, these bond structure changes can induce the formation of defects in the glass that can affect the optical properties of the glass or glass-ceramic substrate.

In view of these considerations, there is a need for articles having, and design approaches utilizing, glass and glass-ceramic substrate-containing articles and subassemblies that are less susceptible to damage and property changes from secondary processing, including ultraviolet light-assisted coating deposition processes. Ultraviolet light-resistant articles and subassemblies can be utilized more effectively in application development programs that employ UV-assisted secondary processing, such as plasma-enhanced coating deposition. Similarly, UV light-resistant articles and subassemblies may also be optimized to obtain superior mechanical properties (e.g., through thick scratch-resistant layers) that are not otherwise obtainable with conventional substrates that are more susceptible to damage from secondary processing. It is to the provision of such technologies that the present disclosure is directed.

BRIEF SUMMARY

Described herein are UV light-resistant articles and subassemblies, particularly articles and subassemblies that are resistant to UV damage associated with UV-assisted secondary processing techniques.

According to an aspect of the disclosure, an ultraviolet light-resistant article is provided that includes: a substrate having a glass or glass-ceramic composition, a substrate thickness between about 0.2 mm and about 1.2 mm, and first and second primary surfaces; an ultraviolet light-absorbing element having a an absorptivity greater than 50% at wavelengths from about 100 nm to about 300 nm (or about 100 nm to about 380 nm) and a thickness between about 10 nm and about 100 nm (or about 10 nm to about 500 nm); and a dielectric stack formed with a plasma-enhanced process. Further, the light-absorbing element is between the substrate and the dielectric stack.

In certain implementations of the foregoing aspect, the dielectric stack includes a first and a second dielectric layer over the first primary surface and the ultraviolet light-absorbing element, the layers characterized by a differing refractive index values. The dielectric stack, according to some of these implementations, includes an alternating sequence of the first and second dielectric layers. Depending on the thickness of each layer, the sequence can number from one set of layers to hundreds of such layers or more.

According to an additional aspect of the disclosure, an ultraviolet light-resistant article is provided that includes: a substrate having a glass or glass-ceramic composition, a substrate thickness between about 0.2 mm and about 1.2 mm, and first and second primary surfaces; a dielectric stack formed with a plasma-enhanced process over the first primary surface; and at least one ultraviolet light-absorbing layer having a an absorptivity greater than 50% at wavelengths from about 100 nm to about 300 nm (or about 100 nm to about 380 nm) and a thickness between about 10 nm and about 100 nm (or about 10 nm to about 200 nm). Further, the at least one light-absorbing layer is within the dielectric stack.

In certain implementations of this aspect, the dielectric stack includes an alternating sequence of first and second dielectric layers, the layers characterized by a differing refractive index values. Depending on the thickness of each layer, the sequence can number from one set of layers to hundreds of such layers or more. Further, the dielectric stack can include one ultraviolet light-absorbing layer, or multiple layers, each located between the alternating sequence of first and second dielectric layers.

In certain implementations of these articles, the ultraviolet light-absorbing element or layer(s) has an extinction coefficient (k) of $\leq 5 \times 10^{-3}$ or $\leq 5 \times 10^{-4}$ at wavelengths from about 400 nm to about 700 nm (either a single wavelength in the range or the entire wavelength range). In some embodiments, the ultraviolet light-absorbing element has an extinction coefficient (k) of $\geq 5 \times 10^{-4}$, (k) of $\geq 5 \times 10^{-3}$, (k) of $\geq 5 \times 10^{-2}$, or even (k) of $\geq 5 \times 10^{-1}$, at wavelengths from about 200 to about 400 nm, from about 250 to about 400 nm, from about 300 to about 400 nm, or from about 250 to about 400 nm. In one or more embodiments, the ultraviolet light absorbing elements and layers can comprise at least one of $AlSiO_xN_y$, $Nb_2O_5$, $Ta_2O_5$, $TiO_2$, $SnO_2$ and $ZnO$. In certain aspects, these elements and layers (or the entire coated article) can have an absorption of greater than 50%, or greater than 75%, at any selected wavelengths in the range from about 100 nm to about 380 nm, from about 200 nm to about 380 nm, from about 200 nm to about 400 nm, from about 250 nm to about 350 nm, or from about 250 nm to about 300 nm. At the same time, the ultraviolet light-absorbing elements or layers (or the entire coated article) may exhibit a light absorption for all wavelengths in the visible range from about 400 nm to about 700 nm that is less than 10%, less than 5%, less than 2%, or less than 1%. A key feature of the ultraviolet light-absorbing layer is that it exhibits a high light absorption in the UV wavelength range and a low absorption in the visible wavelength range.

The dielectric stack, according to some implementations, including the ultraviolet light-resistant element or layer(s) can be configured according to a total thickness between about 10 nm and about 2000 nm. The dielectric stack may further be configured with a maximum indentation hardness of 8 GPa or greater as measured by the Berkovich Indenter Hardness Test defined below. In certain cases, the average indentation hardness of the ultraviolet light-absorbing element or layer(s) as measured by the Berkovich Indenter Hardness Test defined below is within about ±25% of an average indentation hardness of the dielectric stack.

According to a further aspect of the disclosure, a method of making an ultraviolet light-resistant article is provided that includes the steps: providing a substrate having a glass or glass-ceramic composition, a substrate thickness between about 0.2 mm and about 1.2 mm, and first and second primary surfaces; forming at least one ultraviolet light-absorbing layer over a first primary surface, the light-absorbing layer having an absorptivity of about 50% or greater at wavelengths from about 300 nm to about 100 nm and a thickness between about 10 nm and about 100 nm; and forming a dielectric stack with a plasma-assisted process. Further, the light-absorbing layer is configured to inhibit damage to the first primary surface of the substrate from the step of forming the dielectric stack.

In certain implementations of the method, the step for forming a dielectric stack includes forming an alternating sequence of first and second dielectric layers over the first primary surface, the first and second dielectric layers characterized by differing refractive index values. In some of the foregoing implementations, the step for forming the dielectric stack and the step for forming the at least one ultraviolet light-absorbing layer can be conducted such that the at least one light-absorbing layer is a single ultraviolet light-absorbing layer on the first primary surface and the dielectric stack is formed over the light-absorbing layer. In other of the foregoing implementations, the at least one light-absorbing layer is a single light-absorbing layer formed within the dielectric stack. In addition, some aspects of the method have the steps for forming a dielectric stack and at least one ultraviolet light-absorbing layer at substantially the same time to form an alternating sequence of dielectric and ultraviolet light-absorbing layers.

Additional features and advantages will be set forth in the detailed description which follows, and in part will be readily apparent to those skilled in the art from the description or recognized by practicing the various aspects as exemplified in the written description and the appended drawings. It is to be understood that both the foregoing general description and the following detailed description are merely exemplary of the various aspects, and are intended to provide an overview or framework to understanding the nature and character of the invention as it is claimed.

The accompanying drawings are included to provide a further understanding of principles of the invention, and are incorporated in and constitute a part of this specification. The drawings illustrate one or more embodiment(s), and together with the description serve to explain, by way of example, principles and operation of the invention. Directional terms as used herein—for example, up, down, right, left, front, back, top, bottom—are made only with reference to the figures as drawn and are not intended to imply absolute orientation.

Figure 1:
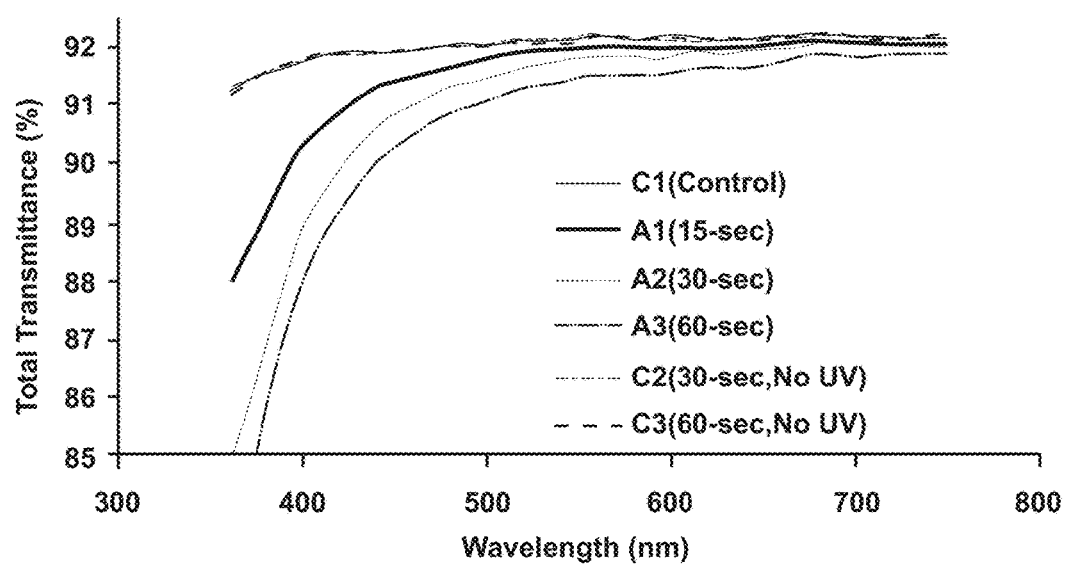
FIG. 1 is a plot of total optical transmittance vs. wavelength for Corning® Gorilla® Glass Code 2319 samples exposed to UV-containing and non-UV-containing light sources.

These and other aspects, advantages, and salient features will become apparent from the following detailed description, the accompanying drawings, and the appended claims.

DETAILED DESCRIPTION

Reference will now be made in detail to the present preferred embodiments, examples of which are illustrated in the accompanying drawings. Whenever possible, the same reference numerals will be used throughout the drawings to refer to the same or like parts. Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

In the following detailed description, for purposes of explanation and not limitation, example embodiments disclosing specific details are set forth to provide a thorough understanding of various principles of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of various principles of the present invention. Finally, wherever applicable, like reference numerals refer to like elements.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

Provided herein are various UV light-resistant articles and subassemblies that have one or more UV light-resistant layers or elements configured to protect an underlying glass or glass-ceramic substrate from layer, coating and other processing steps that subject the substrates to UV light exposure. Advantageously, these UV light-resistant articles are less prone to substrate damage and property changes from secondary processing that employs UV light sources, e.g., plasma-enhanced coating deposition. The UV light-resistant articles also can facilitate more aggressive secondary processing configured to optimize coating-related properties (e.g., scratch resistance). In some cases, the UV light-resistant elements and layers themselves can provide anti-reflective (AR) and scratch resistance for the underlying glass and glass-ceramic substrates.

As demonstrated by FIG. 1, the effects of UV light exposure on glass and glass-ceramic substrates can be significant. In particular, FIG. 1 is a plot of total optical transmittance (%) vs. wavelength (nm) for Corning® Gorilla® Glass Code 2319 substrates exposed to UV-containing and non-UV-containing light sources. A glass substrate with no light exposure is designated "C1," serving as a control. Samples, "A1," "A2," and "A3" are substrates subjected to 15 s, 30 s and 60 s of UV light exposure, respectively. Samples, "C2" and "C3" are subjected to 30 s and 60 s of non-UV light exposure, respectively. In FIG. 1, the C1-C3 samples exhibit relatively constant transmittance levels above 90% between 350 nm and 750 nm. In contrast, the A1-A3 samples experience a significant drop in transmittance, particularly between 350 nm and 450 nm, relative to the C1-C3 sample. The severity of the drop in transmittance increases with increasing UV light exposure time. Based on FIG. 1, it is evident that UV light exposure to glass substrates can result in a loss in optical transmittance for the substrate.

Figure 2A:
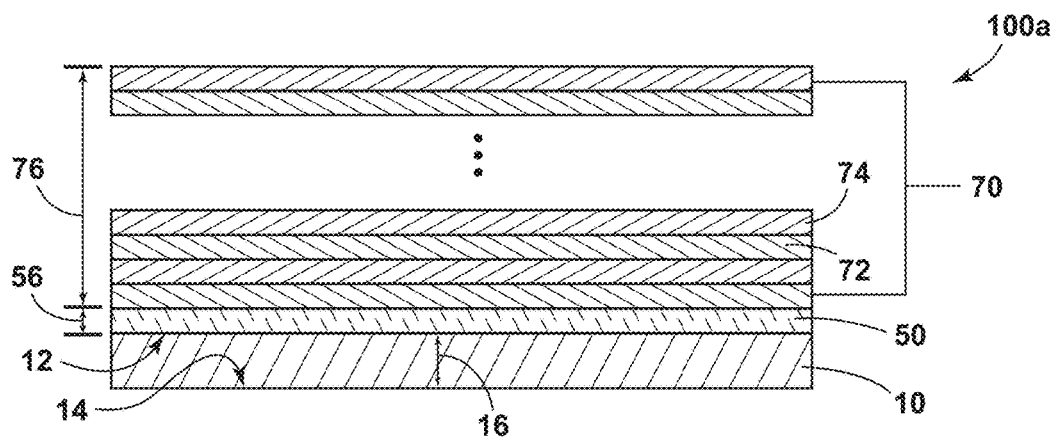
FIG. 2A is a schematic cross-section of a UV light-resistant article comprising a UV light-absorbing element between a substrate and a dielectric stack according to an aspect of the disclosure.
Figure 2B:
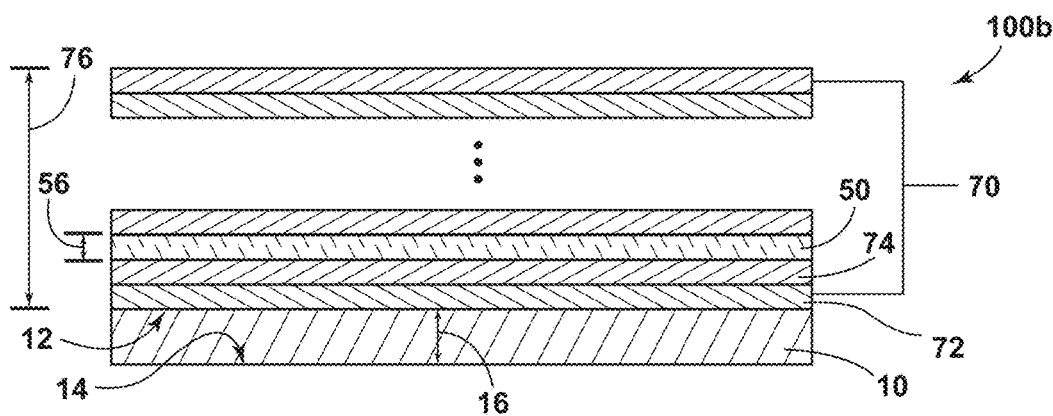
FIG. 2B is a schematic cross-section of a UV light-resistant article comprising a UV light-absorbing layer within a dielectric stack of alternating dielectric layers over a substrate according to an aspect of the disclosure.
Figure 2C:
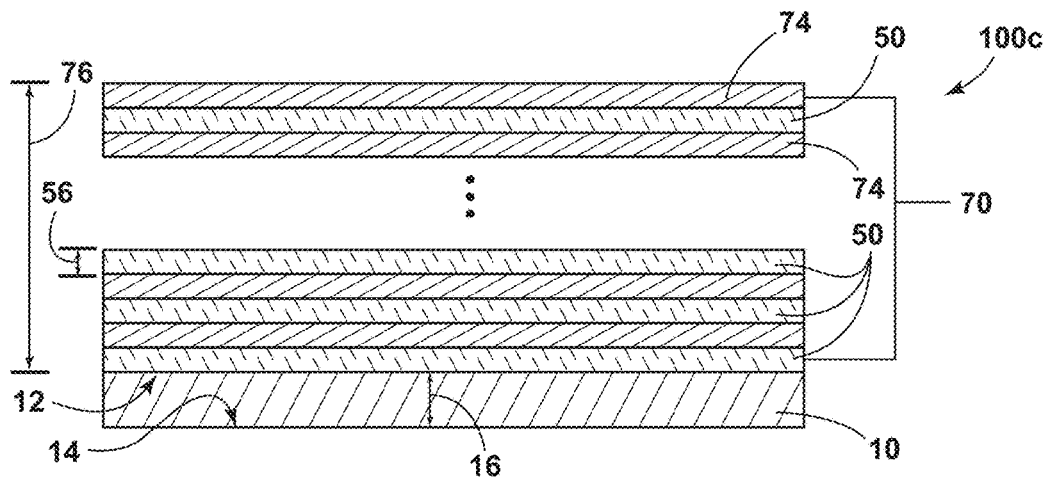
FIG. 2C is a schematic cross-section of a UV light-resistant article comprising UV light-absorbing layers within a dielectric stack of alternating dielectric layers over a substrate according to an aspect of the disclosure.

Referring to FIGS. 2A-2C, UV light-resistant articles 100a, 100b and 100c are depicted in schematic cross sections, respectively. UV light-resistant articles 100a-100c are each configured with one or more UV light-resistant layers 50. Referring to FIG. 2A, UV light-resistant article 100a includes a substrate 10 having primary surfaces 12, 14 and a thickness 16. A UV light-resistant element 50 having a thickness 56 is arranged over the primary surface 12 of the substrate 10. Further, the element 50 is between the primary surface 12 and a dielectric stack 70, also arranged over the primary surface 12. In some embodiments, the dielectric stack 70 includes a set of alternating first and second dielectric layers 72, 74, formed with a plasma-enhanced process. The stack 70 is further characterized by a total thickness 76. In some embodiments, dielectric stack 70 may include a single layer.

As depicted in FIG. 2A, the substrate 10 has a thickness 16 between about 0.2 mm and about 1.2 mm. In some aspects, the thickness 16 is 0.2 mm, 0.25 mm, 0.3 mm, 0.35 mm, 0.4 mm, 0.45 mm, 0.5 mm, 0.55 mm, 0.6 mm, 0.65 mm, 0.7 mm, 0.75 mm, 0.8 mm, 0.85 mm, 0.9 mm, 0.95 mm, 1.0 mm, 1.05 mm, 1.1 mm, 1.15 mm and up to about 1.2 mm. Further, the substrate 10 principally includes materials having glass and glass-ceramic compositions. In certain implementations, the substrate 10 is substantially transparent in the visible spectrum.

For substrates 10 containing a glass composition, the material chosen can be any of a wide range of silicate, borosilicate, aluminosilicate, or boroaluminosilicate glass compositions, which optionally can comprise one or more alkali and/or alkaline earth modifiers. One such glass composition includes the following constituents: 58-72 mole percent (mol %) $SiO_2$; 9-17 mol % $Al_2O_3$; 2-12 mol % $B_2O_3$; 8-16 mol % $Na_2O$; and 0-4 mol % $K_2O$, wherein the ratio $$\frac{Al_2O_3(\text{mol }\%) + B_2O_3(\text{mol }\%)}{\sum \text{modifers}(\text{mol }\%)} > 1,$$

where the modifiers comprise alkali metal oxides. Another glass composition includes the following constituents: 61-75 mol % $SiO_2$; 7-15 mol % $Al_2O_3$; 0-12 mol % $B_2O_3$; 9-21 mol % $Na_2O$; 0-4 mol % $K_2O$; 0-7 mol % MgO; and 0-3 mol % CaO. Yet another illustrative glass composition includes the following constituents: 60-70 mol % $SiO_2$; 6-14 mol % $Al_2O_3$; 0-15 mol % $B_2O_3$; 0-15 mol % $Li_2O$; 0-20 mol % $Na_2O$; 0-10 mol % $K_2O$; 0-8 mol % MgO; 0-10 mol % CaO; 0-5 mol % $ZrO_2$; 0-1 mol % $SnO_2$; 0-1 mol % $CeO_2$; less than 50 parts per million (ppm) $As_2O_3$; and less than 50 ppm $Sb_2O_3$; wherein 12 mol %≤$Li_2O+Na_2O+K_2O$≤20 mol %, and 0 mol %≤MgO+CaO≤10 mol %. Still another illustrative glass composition includes the following constituents: 55-75 mol % $SiO_2$, 8-15 mol % $Al_2O_3$, 10-20 mol % $B_2O_3$; 0-8% MgO, 0-8 mol % CaO, 0-8 mol % SrO, and 0-8 mol % BaO. Further, in certain aspects of the substrates 10 employed in the UV light-resistant articles 100a, 100b and 100c, the substrate may possess a glass composition that includes $SiO_2$, $Al_2O_3$ and at least two oxides selected from the group consisting of $B_2O_3$, $P_2O_5$, MgO, CaO, SrO, BaO, ZnO, $Na_2O$, $K_2O$, and $Li_2O$.

Similarly, with respect to glass-ceramics employed as the substrate 10, the material chosen can be any of a wide range of materials having both a glassy phase and a ceramic phase. Illustrative glass-ceramics include those materials where the glass phase is formed from a silicate, borosilicate, aluminosilicate, or boroaluminosilicate, and the ceramic phase is formed from β-spodumene, β-quartz, nepheline, kalsilite, or carnegieite.

Regardless of the material chosen for the substrate 10, the substrate can adopt a variety of physical forms. That is, from a cross-sectional perspective, the substrate 10 can be flat or planar, or it can be curved and/or sharply-bent. Similarly, it can be a single unitary object, or a multi-layered structure or laminate.

In certain situations, the substrate 10 can be subjected to an optional treatment prior to disposing the dielectric stack 70 and the UV light-resistant layer 50. Examples of such treatments include physical or chemical cleaning, physical or chemical strengthening (e.g., by thermal tempering, chemical ion-exchange, or like processes in the case of a glass), physical or chemical etching, physical or chemical polishing, annealing, sintering, shaping, and/or the like. Such processes are known to those skilled in the art to which this disclosure pertains.

Referring again to the UV light-resistant article 100a of FIG. 2A, in some embodiments, the UV light-resistant element 50 is a UV light absorbing layer that exhibits an absorption of greater than 50% at wavelengths from about 100 nm to about 300 nm, from about 100 nm to about 380 nm, from about 200 nm to about 380 nm, from about 200 to about 400 nm, from about 250 nm to about 350 nm, or from about 250 nm to about 300 nm. At the same time, the ultraviolet light-absorbing elements or layers (or the entire coated article) may exhibit a light absorption for all wavelengths in the visible range from about 400 nm to about 700 nm that is less than 10%, less than 5%, less than 2%, or less than 1%. A key feature of the ultraviolet light-absorbing layer is that it exhibits a high light absorption in the UV wavelength range and a low absorption in the visible wavelength range. In certain aspects, the absorption can be greater than about 75% in the above wavelength ranges. Preferably, the absorption is greater than about 90% in the above wavelength ranges. As used herein, absorption is the percentage of optical energy absorbed by a material, that is, optical energy that is lost through thermal transitions and no longer remains as optical energy that can be transmitted, reflected, or scattered in the form of optical (i.e., electromagnetic) energy. Absorption can be measured using spectroscopic ellipsometry. In other aspects, the UV light-resistant element 50 is configured with an extinction coefficient (k) of ≤$5\times10^{-3}$ or ≤$5\times10^{-4}$ at wavelengths from about 400 nm to about 700 nm (either a single wavelength in the range or the entire wavelength range). In some embodiments, the ultraviolet light-absorbing element has an extinction coefficient (k) of ≥$5\times10^{-4}$, (k) of ≥$5\times10^{-3}$, (k) of ≥$5\times10^{-2}$, or even (k) of ≥$5\times10^{-1}$, at wavelengths from about 200 to about 400 nm, from about 250 to about 400 nm, from about 300 to about 400 nm, or from about 250 to about 400 nm. In one or more embodiments, the ultraviolet light absorbing elements and layers can comprise at least one of $AlSiO_xN_y$, $Nb_2O_5$, $Ta_2O_5$, $TiO_2$, $SnO_2$ and ZnO. More generally, elements 50 possessing lower extinction coefficients can demonstrate higher absorption in the UV spectrum. As used herein, the extinction coefficient (k) represents the imaginary component of the refractive index k that is directly related to the amount of light absorbed in the material. In certain aspects, these elements and layers (or the entire coated article) can have an absorption of greater than 50%, or greater than 75%, at any selected wavelengths in the range.

In other aspects, the UV protection capability of the UV light-absorbing element 50 is manifested in little to no change in the color attributes of the substrate 10 upon processing associated with the dielectric stack 70. Put another way, the UV light-resistant article 100a experiences little to no color shifts upon processing of the dielectric stack in view of the protection provided by the UV light-absorbing element 50. In certain implementations, the shifts in the a* and b* color coordinates of the article 100a in the CIE L*, a*, b* colorimetry system have a magnitude of 4 or less upon exposure to visible light at a normal incidence angle. The color coordinates a* and b* are observed under a D65 and/or F2 illuminant.

With regard to the thickness 56 of the UV light-resistant element 50 employed in the UV light-resistant article 100a, it can range between 10 nm and about 100 nm, 10 nm and about 200 nm, 10 nm and about 300 nm, 10 nm and about 400 nm, 10 nm and about 500 nm, and any ranges therebetween. In certain implementations, the thickness 56 of the element 50 can be 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm about 100 nm, about 125 nm, about 150 nm, about 175 nm, about 200 nm, about 225 nm, about 250 nm, about 275 nm, about 300 nm, about 325 nm, about 350 nm, about 375 nm, about 400 nm, about 425 nm, about 450 nm, about 475 nm, and up to about 500 nm.

The UV light-resistant element 50 can comprise various compositions, preferably oxide and nitride compositions that result in high UV light absorptivity. In one aspect, the element 50 can include at least one of $AlSiO_xN_y$, $Nb_2O_5$, $Ta_2O_5$, $TiO_2$, $SnO_2$ and ZnO. Preferably, the element 50 is fabricated from an $AlSiO_xN_y$ material. In certain implementations, the amount of nitrogen and/or Si in the $AlSiO_xN_y$ material is maximized as it is believe that higher percentages of these elements within the UV light-resistant element 50 contribute to improved UV light absorptivity without compromising other properties, including mechanical properties.

In certain aspects of the UV light-resistant article 100a-100c, the dielectric stack 70 is configured with high indentation hardness levels such that it can function as a scratch resistant layer. For example, the dielectric stack 70 can possess a maximum indentation hardness of 8 GPa or greater, as measured by the Berkovich Indenter Hardness Test. As used herein, the "Berkovich Indenter Hardness Test" includes measuring the hardness of a material on a surface thereof by indenting the surface with a diamond Berkovich indenter. The Berkovich Indenter Hardness Test includes indenting the dielectric stack 70 (or the surface of any one or more of the layers in the stack) with the diamond Berkovich indenter to form an indent to an indentation depth in the range from about 50 nm to about 1000 nm (or the entire thickness of the anti-reflective coating or layer, whichever is less) and measuring the maximum hardness from this indentation along the entire indentation depth range or a segment of this indentation depth (e.g., in the range from about 100 nm to about 600 nm), generally using the methods set forth in Oliver, W. C.; Pharr, G. M. An improved technique for determining hardness and elastic modulus using load and displacement sensing indentation experiments. *J. Mater. Res.*, Vol. 7, No. 6, 1992, 1564-1583; and Oliver, W. C.; Pharr, G. M. Measurement of Hardness and Elastic Modulus by Instrument Indentation: Advances in Understanding and Refinements to Methodology. *J. Mater. Res.*, Vol. 19, No. 1, 2004, 3-20. As used herein, hardness refers to a maximum hardness, and not an average hardness.

In some embodiments, UV light resistant articles 100a-100c has a maximum indentation hardness of 8 GPa or greater as measured by the Berkovich Indenter Hardness Test. In some of these aspects, the UV light-absorbing element 50 is configured with a maximum indentation hardness as measured by the Berkovich Indenter Hardness Test that is comparable to the maximum indentation hardness of the dielectric stack 70 and/or UV light resistant articles 100a-100c. Preferably, in these aspects, the element 50 exhibits a maximum indentation hardness as measured by the Berkovich Indenter Hardness Test within about ±25% or about ±50% of the maximum indentation hardness of the dielectric stack 70 and/or UV light resistant articles 100a-100c.

In the UV light-resistant article 100a depicted in FIG. 2A, the alternating, first and second dielectric layers 72, 74 can be configured with differing refractive index values. As such, article 100a can contain multiples of the first and second dielectric layers or one set of the layers 72, 74. In certain implementations, the total stack thickness 76 can range between about 10 nm and about 2000 nm, depending on the number of layers 72, 74 and the thickness of each layer. Further, in some embodiments, the thickness 76 of the dielectric stack 70 can range from 10 nm, 50 nm, 75 nm, 100 nm, 200 nm, 300 nm, 400 nm, 500 nm, 600 nm, 700 nm, 800 nm, 900 nm, 1000 nm, 1100 nm, 1200 nm, 1300 nm, 1400 nm, 1500 nm, 1600 nm, 1700 nm, 1800 nm, 1900 nm and 2000 nm.

Although the UV light-resistant article 100a shown in FIG. 2A is depicted as containing a dielectric stack 70 having an alternating set of first and second dielectric layers 72, 74, certain implementations of the stack 70 can include only one type of dielectric layer. Other implementations of the stack 70 include three or more dielectric layers. Other aspects rely on some dielectric layers within the stack 70 and additional non-dielectric layers. Still further, certain configurations of the stack 70 employ dielectric layers 72, 74 (and others) that exhibit the same or similar refractive indices. In general, various configurations of the stack 70 are feasible for the UV light-resistant article 100a, provided that they involve one or more steps that subject the underlying substrate 10 to UV light, necessitating protection from the UV light-absorbing element 50.

Referring to FIG. 2B, the UV light-resistant article 100b includes a substrate 10 having primary surfaces 12, 14 and a thickness 16. A UV light-resistant element 50 having a thickness 56 is arranged over the primary surface 12 of the substrate 10. Further, the element 50 is within the dielectric stack 70, arranged over a set of dielectric layers 72, 74. The dielectric stack 70 employed in the article 100b includes a set of alternating first and second dielectric layers 72, 74, formed with a plasma-enhanced process. The stack 70 is further characterized by a total thickness 76.

Referring again to FIG. 2B, the like-numbered elements of the article 100b and 100a have the same or a similar function, structure and variations. The element 50 can be placed at various locations within the dielectric stack 70. As depicted in FIG. 2B, the element 50 is a single layer located over one set of dielectric layers 72, 74. In other implementations, the element 50 is located at a position above multiple sets of dielectric layers 72, 74. Placing the element 50 deeper within the stack 70 (i.e., closer to the primary surface 12) maximizes the portion of the stack 70, and the ultraviolet light associated with it, that can be shielded from the underlying substrate 10. Conversely, certain applications may benefit from placing the element 50 closer to the exterior surface of the dielectric stack 70, depending on its own optical and/or mechanical properties.

With regard to FIG. 2C, the UV light-resistant article 100c includes a substrate 10 having primary surfaces 12, 14 and a thickness 16. A set of UV light-resistant elements 50, each having a thickness 56, is arranged over the primary surface 12 of the substrate 10. Further, the elements 50 are located within the dielectric stack 70, arranged in an alternating sequence with dielectric layer 74. That is, the dielectric stack 70 employed in the article 100c includes a set of alternating first and second dielectric layers 72, 74, formed with a plasma-enhanced process. The stack 70 is further characterized by a total thickness 76.

Referring again to FIG. 2C, the like-numbered elements of the article 100c and 100a have the same or a similar function, structure and variations. As depicted in FIG. 2C, the element 50 is part of set of such elements, each located over a dielectric layer 74. In other implementations, the element 50 is located at a position above multiple sets of dielectric layers, some of which may differ from dielectric layer 74. By placing an element 50 beneath a subsequent, alternating dielectric layer (e.g., layer 74), each element 50 can provide protection to the underlying substrate 10 from UV light exposure associated with processing of the dielectric layer 74 above it.

According to another embodiment, a method of making an ultraviolet light-resistant article (e.g., articles 100a-100c) is provided that includes a set of steps. First, a substrate (e.g., substrate 10) having a glass or glass-ceramic composition is provided. The substrate is characterized by a substrate thickness (e.g., thickness 16) between about 0.2 mm and about 1.2 mm, along with first and second primary surfaces (e.g., primary surfaces 12, 14). A second step of the method is forming one or more ultraviolet light-absorbing layers (e.g., light-absorbing element 50) over a first primary surface, the light-absorbing layer having an absorptivity of about 50% or greater at wavelengths from about 300 nm to about 100 nm and a thickness between about 10 nm and about 100 nm. A third step of the method is forming a dielectric stack (e.g., stack 70) with a plasma-assisted process. Further, the light-absorbing layer is configured to inhibit damage to the first primary surface of the substrate from the step of forming the dielectric stack.

In certain implementations of the method, the step for forming a dielectric stack (e.g., stack 70) includes forming an alternating sequence of first and second dielectric layers (e.g., dielectric layers 72, 74) over the first primary surface, the first and second dielectric layers characterized by differing refractive index values. In some of the foregoing implementations, the step for forming the dielectric stack and the step for forming the one or more ultraviolet light-absorbing layers (e.g., UV light-absorbing element 50) can be conducted such that the light-absorbing layer (or layers) is a single UV light-absorbing layer on the first primary surface and the dielectric stack is formed over the light-absorbing layer (e.g., consistent with the UV light-resistant article 100a depicted in FIG. 2A). In other of the foregoing implementations, the UV light-absorbing layer is a single light-absorbing layer formed within the dielectric stack (e.g., consistent with the UV light-resistant article 100b depicted in FIG. 2B). In a further aspect, alternating UV light-absorbing layers are formed above or beneath one or more dielectric layers to form a dielectric stack having alternating UV light-absorbing and dielectric layers (e.g., consistent with the UV light-resistant article 100c depicted in FIG. 2C). In addition, some aspects of the method have the steps for forming a dielectric stack and at least one ultraviolet light-absorbing layer at substantially the same time to form an alternating sequence of dielectric and ultraviolet light-absorbing layers.

As outlined earlier, aspects of the UV light-resistant articles and the methods for making them according to the disclosure can be employed to protect a glass or glass-ceramic substrate (e.g., substrate 10) from UV light that is generated during a film deposition process used to form any of various secondary films for the substrate, including a dielectric stack (e.g., dielectric stack 70). In particular, a deposition process that employs plasma, which is known to generate high levels of UV radiation, can damage an underlying glass or glass-ceramic substrate. These film deposition processes include plasma-enhanced chemical vapor deposition (PECVD), reactive and non-reactive sputtering, DC or RF sputtering, plasma- or ion beam-assisted evaporation and related methods employing UV radiation and/or emanating UV radiation as a byproduct.

In certain implementations, aspects of the UV light-resistant articles and the methods for making them of the disclosure can be employed to protect a glass or glass-ceramic substrate (e.g., substrate 10) from UV exposure during a cleaning process, such as a plasma cleaning or a UV ozone cleaning process.

Additionally, the coatings, treatments and related aspects of the disclosure may be used to protect a glass substrate, glass article, a display, or an electronic device containing said glass or coatings from UV exposure due to sunlight. This can be particularly important in outdoor applications where long-term exposure to UV is possible, such as in windows, outdoor signage, outdoor electronic displays, traffic signage, billboards, road signage, solar panels, and the like. In one aspect of the disclosure, a UV light-resistant article having one or more UV light-resistant layers possesses a maximum indentation hardness greater than 8 GPa as measured by the Berkovich Indenter Hardness Test, a maximum indentation hardness 8 Gpa or greater for the UV light-resistant article as measured by the Berkovich Indenter Hardness Test, a color shift less than about 4.0 in a* or b* at normal incidence or at varying angles, and a UV absorption greater than about 50%, greater than 75%, or greater than 90% for UV light with wavelengths less than about 300 nm, less than about 250 nm, or less than about 200 nm. The coated surface of the article may optionally have a reflectance that is less than about 10%, less than about 5%, less than about 4%, less than about 3%, less than about 2%, or less than about 1%.

Figure 3:
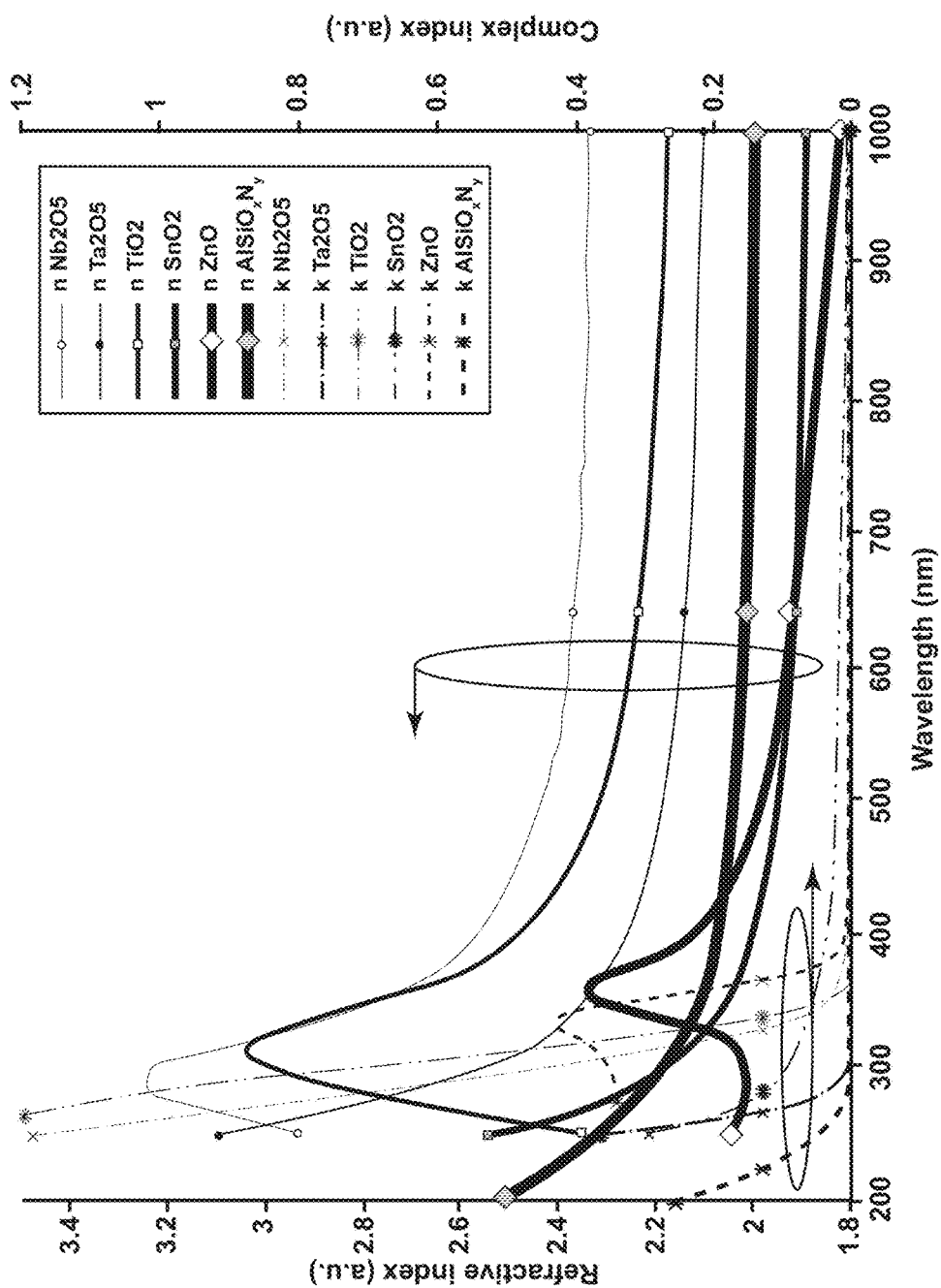
FIG. 3 is a schematic plot of real and imaginary refractive index values as a function of wavelength for various oxide materials suitable for use in the UV light-absorbing layers and elements according to aspects of the disclosure.

Referring to FIG. 3, a schematic plot of real and imaginary refractive index values as a function of wavelength (nm) for various oxide materials suitable for use in the UV light-absorbing layers and elements (e.g., UV light-resistant element 50) according to aspects of the disclosure. These oxide materials include $Nb_2O_5$, $Ta_2O_5$, $TiO_2$, $SnO_2$ and ZnO. As demonstrated by FIG. 3, each of these materials exhibit relatively high real (n) and imaginary (k) refractive index components at wavelengths less than 400 nm in the UV range. It is also evident from FIG. 3 that certain materials can be selected for the UV light-resistant elements according the disclosure as a function of the expected wavelength range of the UV light source. For example, $Nb_2O_5$ exhibits particularly high refractive index components for wavelengths of less than 250 nm. In contrast, ZnO tends to exhibit particularly high refractive index component values for wavelengths between 250 nm and 400 nm.

Figure 4:
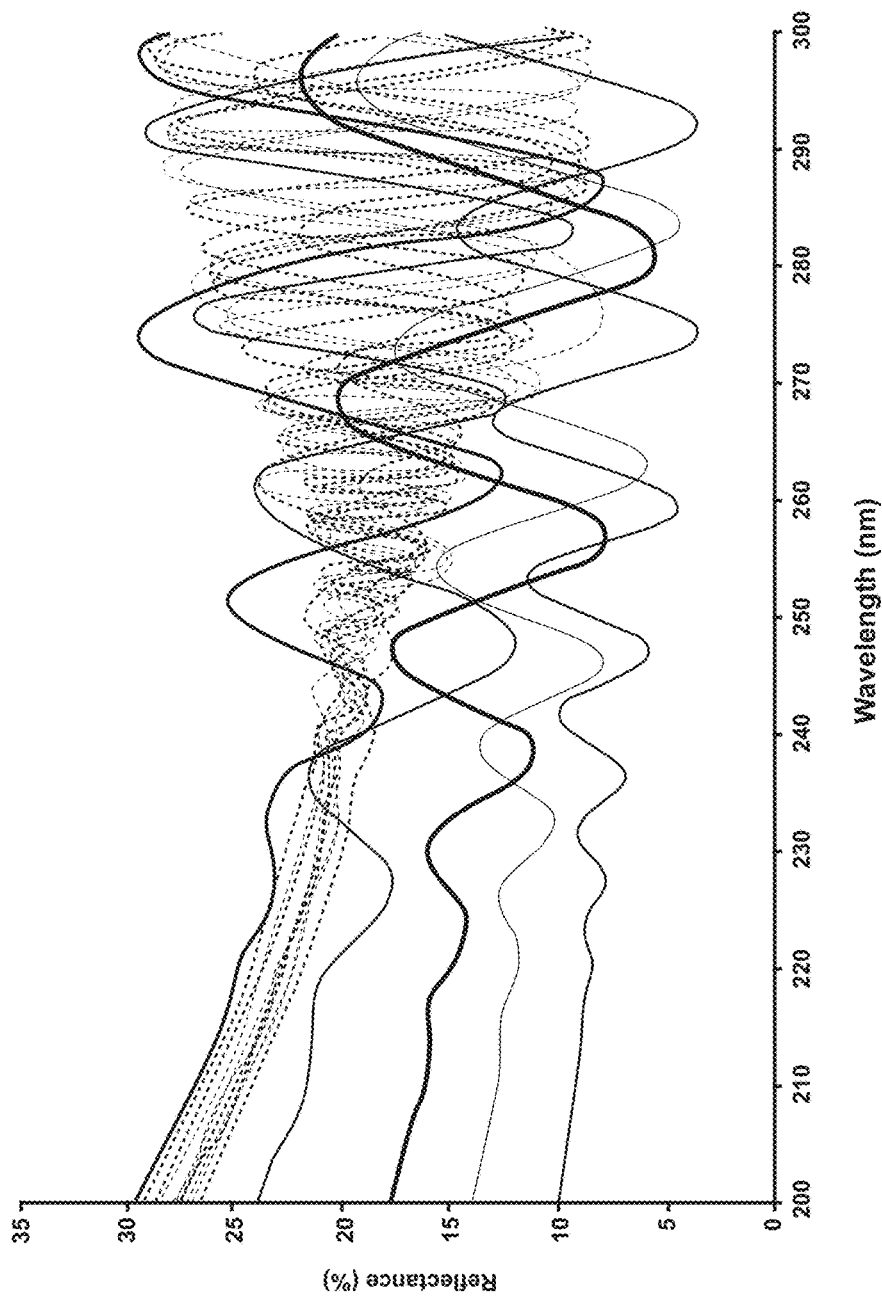
FIG. 4 is a plot of reflectance as a function of wavelength for various aluminum silicon oxynitride materials suitable for use in the UV light-absorbing layers and elements according to aspects of the disclosure.

As depicted in FIG. 4, aluminum silicon oxynitlide (i.e., $AlSiO_xN_y$) materials are also suitable to employ as the UV light-resistant element according to some embodiments in the disclosure. In FIG. 4, a plot of reflectance (%) as a function of wavelength (nm) for various aluminum silicon oxynitride materials suitable for use as UV light-resistant elements. Reflectance values tend to vary between about 30% and 10% between approximately 200 nm and 300 nm for these materials. In general, the materials demonstrating the highest reflectance values have higher nitrogen and/or aluminum percentages relative to the other constituents of the aluminum silicon oxynitride materials.

According to a preferred aspect of the disclosure, a UV light-resistant article consistent with UV light-resistant article 100a can include a substrate, a single UV light-resistant element and a dielectric stack (e.g., functioning as a scratch-resistant coating) as outlined in Table 1 below. More specifically, the design of the UV light-resistant article outlined in Table 1 includes a UV light-resistant layer between the dielectric stack and the substrate. Also, in this aspect, the total thickness of the dielectric stack and UV light-resistant article is about 2179 nm

TABLE 1

| Feature | Layer | Material | Refractive Index | Thickness (nm) |
|---|---|---|---|---|
| Dielectric stack | 1 | $SiO_2$ | 1.46 | 12 |
| | 2 | $AlSiO_xN_y$ | 2.03 | 2000 |
| | 3 | $SiO_2$ | 1.46 | 8.67 |
| | 4 | $AlSiO_xN_y$ | 2.03 | 43.82 |
| | 5 | $SiO_2$ | 1.46 | 30.5 |
| | 6 | $AlSiO_xN_y$ | 2.03 | 26.3 |
| | 7 | $SiO_2$ | 1.46 | 53.8 |
| UV light-resistant layer | 8 | $Nb_2O_5$ | 2.35 | 4.9 |
| Substrate | N/A | Corning Gorilla Glass ® Glass Code 4318 | 1.51 | N/A |

Figure 5A:
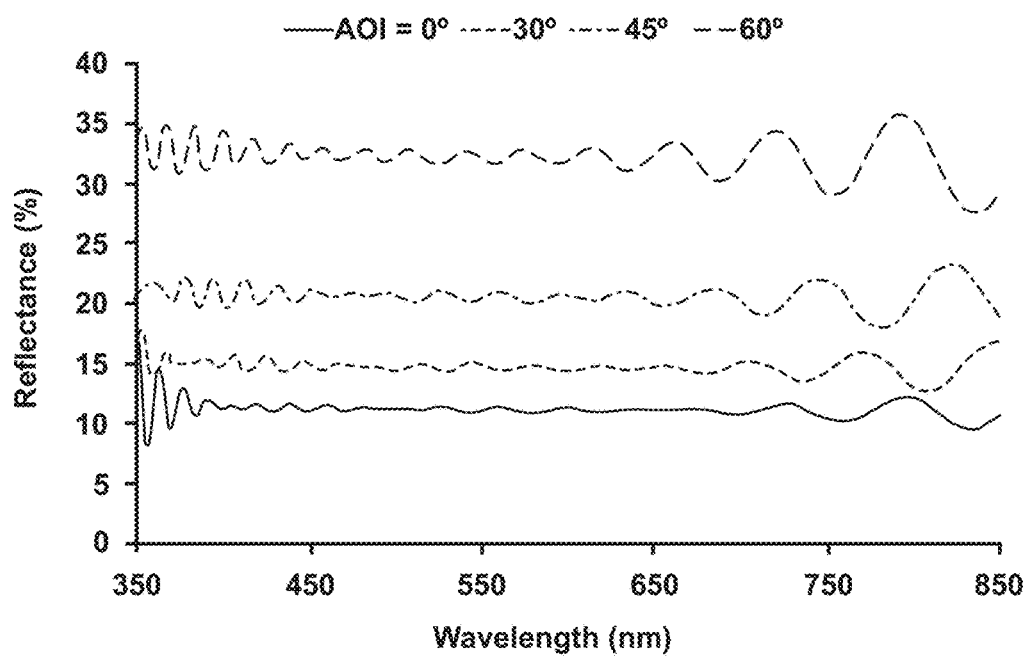
FIGS. 5A and 5B are plots of reflectance and transmittance, respectively, as a function of wavelength for a UV light-resistant article comprising a UV light-absorbing element between a substrate and a dielectric stack according to an aspect of the disclosure.
Figure 5B:
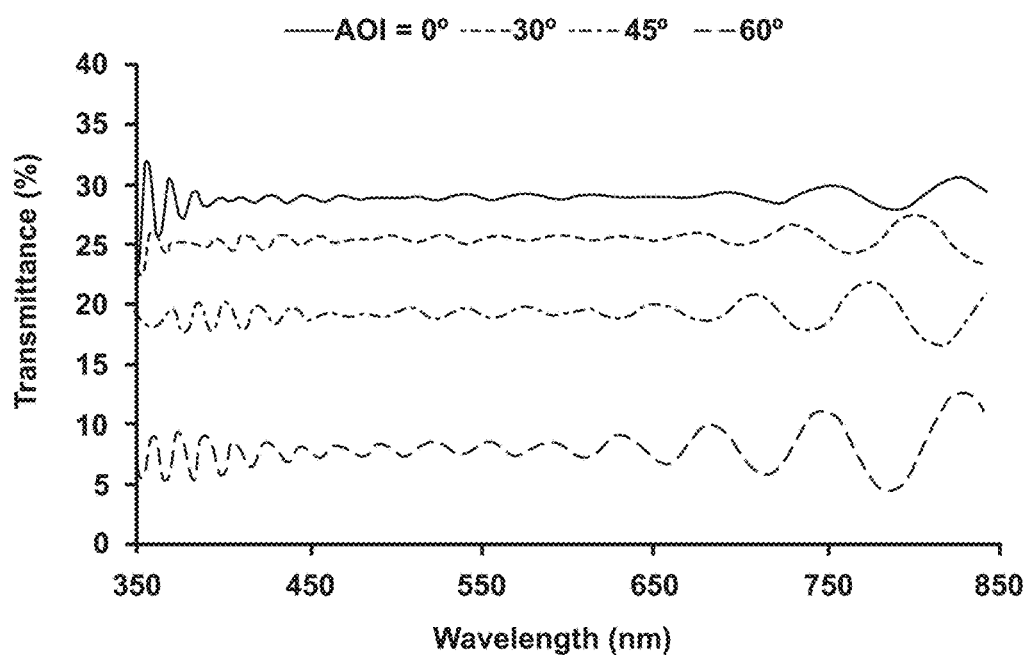
Figure 5C:
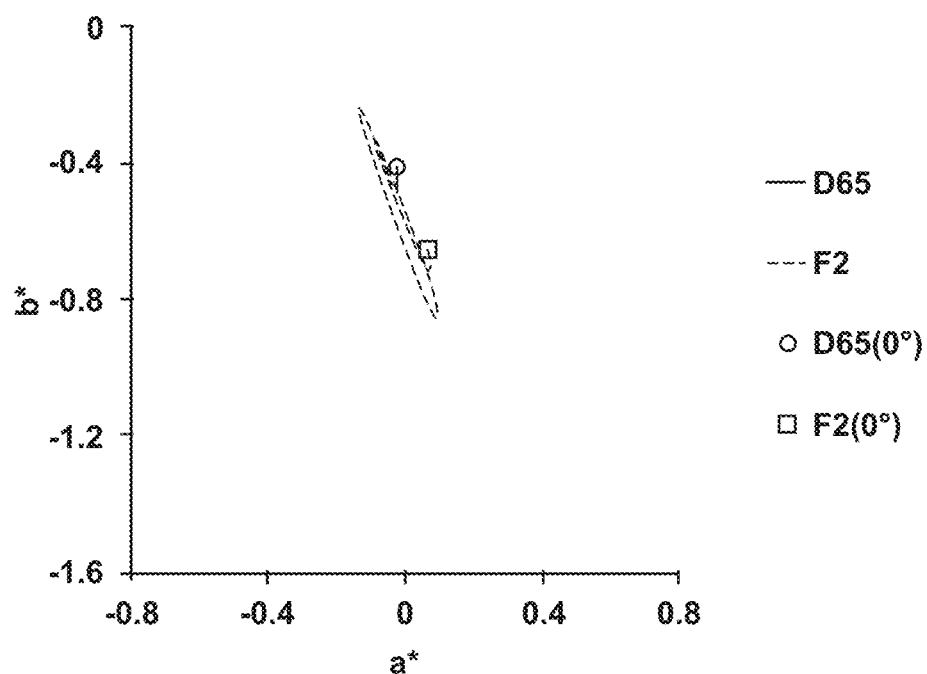
FIGS. 5C and 5D are plots of color parameters for the articles of FIGS. 5A and 5B, as measured from exposure to D65 and F2 illumination sources over a range of incident angles from 0° to 60° according to an aspect of the disclosure.
Figure 5D:
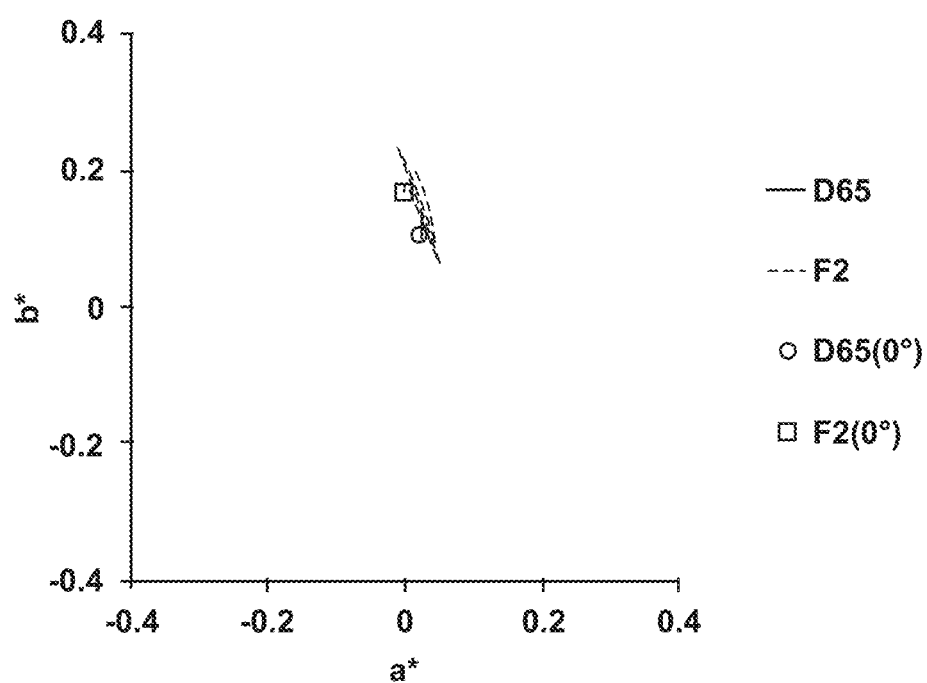

Referring to FIGS. 5A and 5B, plots of reflectance (%) and transmittance (%), respectively, as a function of wavelength (nm) for the UV light-resistant article outlined in Table 1 demonstrate the effectiveness of the $Nb_2O_5$ UV light-resistant layer in minimizing or otherwise preventing damage to a glass substrate from UV radiation associated with processing of a dielectric stack. Similarly, FIGS. 5C and 5D are plots of color parameters for the UV light-resistant article outlined in Table 1, as measured from exposure to D65 and F2 illumination sources over a range of incident angles from 0° to 60°. The plot in FIG. 5C relates to color shift measurements obtained from reflectance of an incident source off of the structure in Table 1. The plot in 5D relates to color shift measurements obtained from transmittance from an incident source through the structure in Table 1. In both figures, the "D65" and "F2" samples correspond to illumination with respective D65 and F2 sources through a range of incident angles from 0° to 60°. In comparison, the "D65 (0° C.)" and "F2 (0° C.)" samples correspond to illumination with respective D65 and F2 sources with a 0° incident angle. Based on the plots depicted in FIGS. 5C and 5D, it is evident that the color shift has a magnitude of no more than about 0.2 for the a* parameter, and about 0.4 for the b* parameter.

According to an additional preferred aspect of the disclosure, a UV light-resistant article consistent with UV light-resistant article 100c can include a substrate, three UV light-resistant elements and a dielectric stack (e.g., functioning as a scratch-resistant coating) as outlined in Table 2 below. More specifically, the design of the UV light-resistant article outlined in Table 2 includes a dielectric stack disposed over a substrate. The dielectric stack includes alternating $Nb_2O_5$ UV light-resistant layers and silica or silicon aluminum oxynitride layers. Also, in this aspect, the total thickness of the dielectric stack and UV light-resistant article is about 2160 nm

TABLE 2

| Feature | Layer | Material | Refractive Index | Thickness (nm) |
|---|---|---|---|---|
| Dielectric stack/UV light-resistant layers | 1 | $SiO_2$ | 1.46 | 12 |
| | 2 | $SiAlO_xN_y$ | 2.03 | 2000 |
| | 3 | $SiO_2$ | 1.46 | 13.27 |
| | 4 | $Nb_2O_5$ | 2.35 | 21.03 |
| | 5 | $SiO_2$ | 1.46 | 37.34 |
| | 6 | $Nb_2O_5$ | 2.35 | 16.73 |
| | 7 | $SiO_2$ | 1.46 | 53.94 |
| | 8 | $Nb_2O_5$ | 2.35 | 5.84 |
| Substrate | N/A | Corning Gorilla Glass ® Glass Code 4318 | 1.51 | N/A |

Figure 6A:
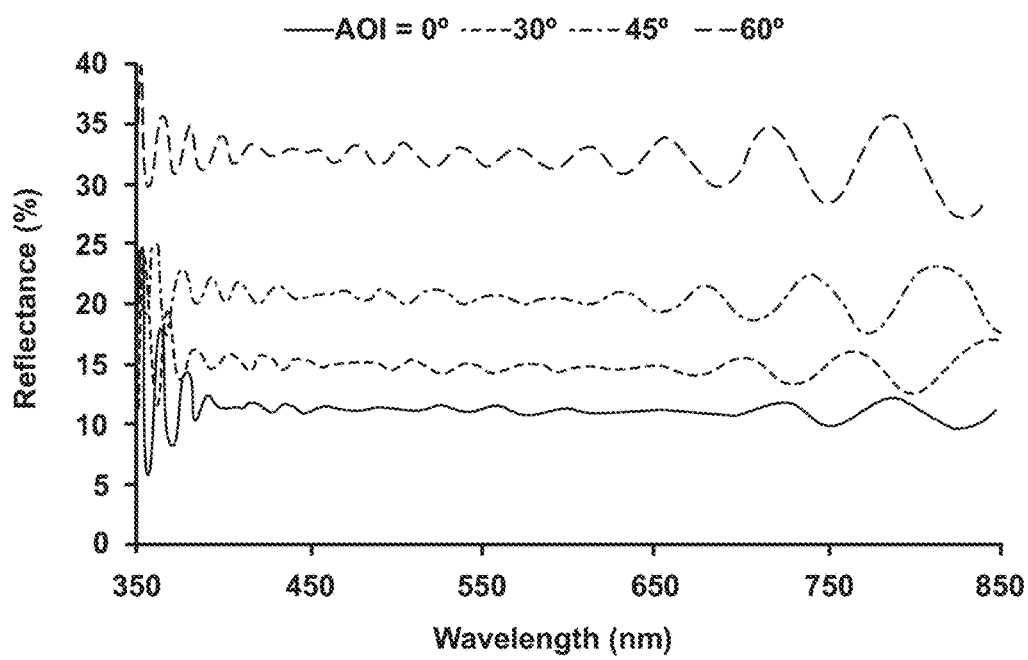
FIGS. 6A and 6B are plots of reflectance and transmittance, respectively, as a function of wavelength for a UV light-resistant article comprising UV light-absorbing layers within a dielectric stack over a substrate according to an aspect of the disclosure.
Figure 6B:
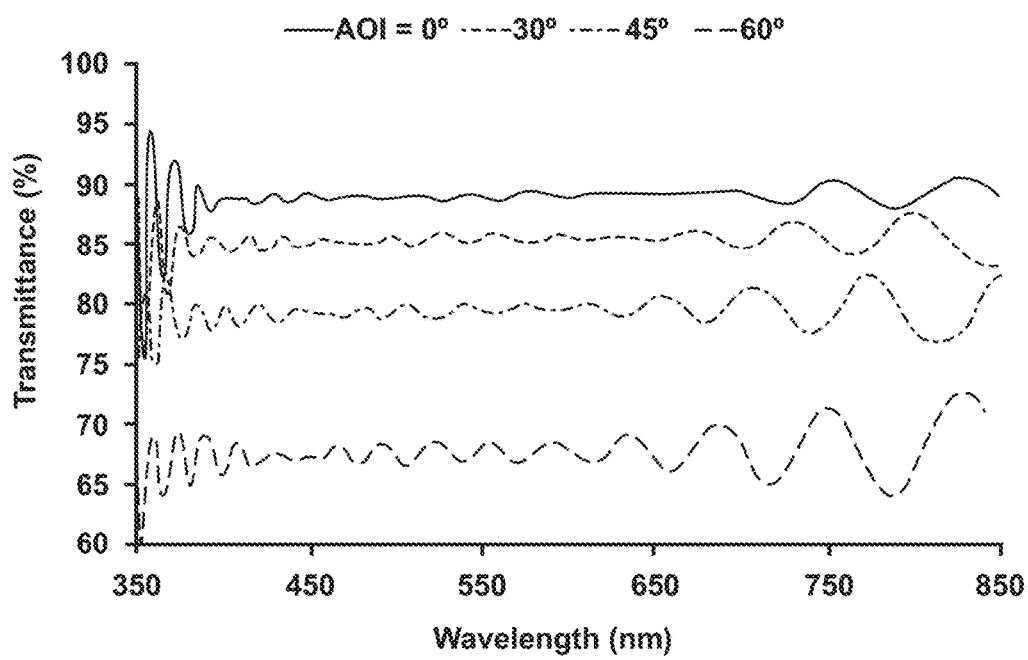
Figure 6C:
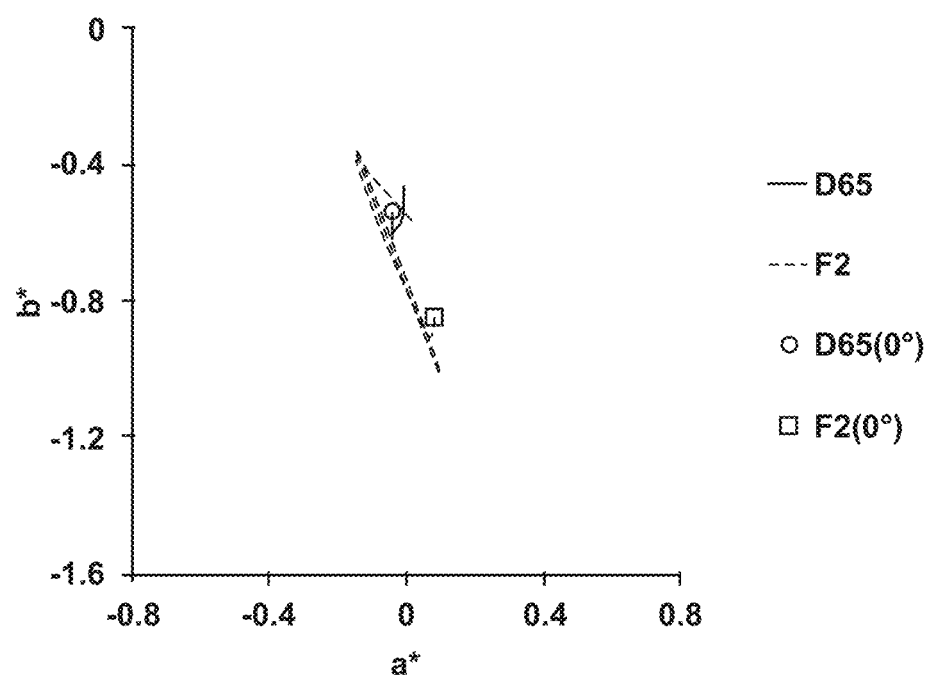
FIGS. 6C and 6D are plots of color parameters for the articles of FIGS. 6A and 6B, as measured from exposure to D65 and F2 illumination sources over a range of incident angles from 0° to 60° according to an aspect of the disclosure.
Figure 6D:
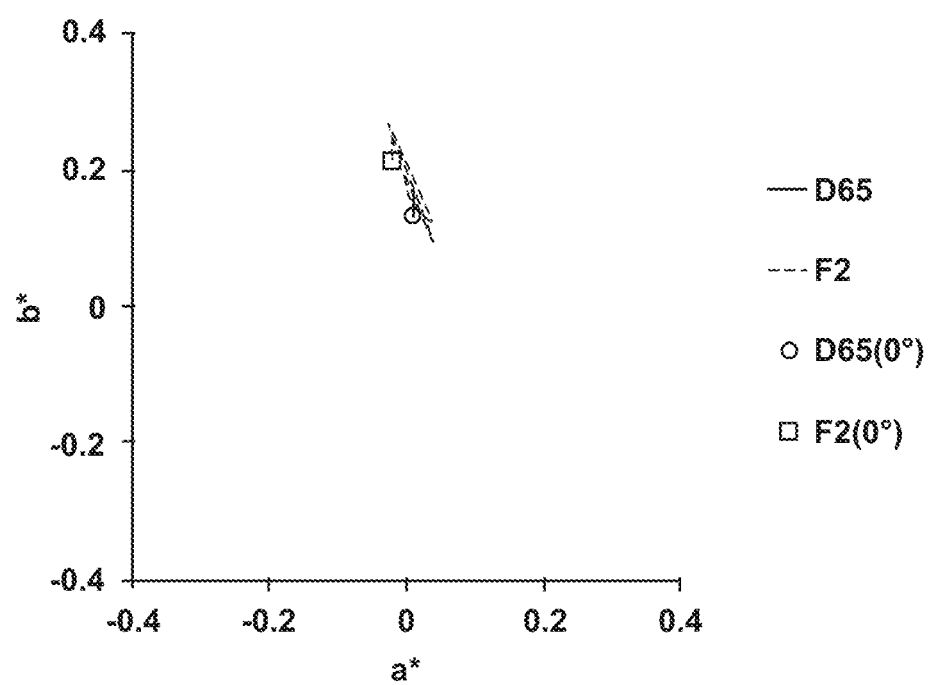

Referring to FIGS. 6A and 5B, plots of reflectance (%) and transmittance (%), respectively, as a function of wavelength (nm) for the UV light-resistant article outlined in Table 2 demonstrate the effectiveness of the $Nb_2O_5$ UV light-resistant layers in minimizing or otherwise preventing damage to a glass substrate from UV radiation associated with processing of a dielectric stack. Similarly, FIGS. 6C and 6D are plots of color parameters for the UV light-resistant article outlined in Table 2, as measured from exposure to D65 and F2 illumination sources over a range of incident angles from 0° to 60°. The plot in FIG. 6C relates to color shift measurements obtained from reflectance of an incident source off of the structure in Table 2. The plot in 6D relates to color shift measurements obtained from transmittance from an incident source through the structure in Table 2. In both figures, the "D65" and "F2" samples correspond to illumination with respective D65 and F2 sources through a range of incident angles from 0° to 60°. In comparison, the "D65 (0° C.)" and "F2 (0° C.)" samples correspond to illumination with respective D65 and F2 sources with a 0° incident angle. Based on the plots depicted in FIGS. 6C and 6D, it is evident that the color shift has a magnitude of no more than about 0.3 for the a* parameter, and about 0.6 for the b* parameter.

According to a further preferred aspect of the disclosure, a UV light-resistant article consistent with UV light-resistant article 100c can include a substrate, three UV light-resistant elements and a dielectric stack (e.g., functioning as a scratch-resistant coating) as outlined in Table 3 below. More specifically, the design of the UV light-resistant article outlined in Table 3 includes a dielectric stack disposed over a substrate. The dielectric stack includes alternating $Nb_2O_5$ UV light-resistant layers and silica or aluminum oxynitride layers. Also, in this aspect, the total thickness of the dielectric stack and UV light-resistant article is about 2171 nm. In this embodiment, the final layer of the dielectric stack, aluminum oxynitride, exhibits a particularly high hardness with a high refractive index.

TABLE 3

| Feature | Layer | Material | Refractive Index | Thickness (nm) |
|---|---|---|---|---|
| Dielectric stack/UV light-resistant layers | 1 | $AlO_xN_y$ | 7.85 | 2000 |
| | 2 | $SiO_2$ | 1.48 | 14.78 |
| | 3 | $Nb_2O_5$ | 2.38 | 20.62 |
| | 4 | $SiO_2$ | 1.48 | 37.1 |
| | 5 | $Nb_2O_5$ | 2.38 | 23.64 |
| | 6 | $SiO_2$ | 1.48 | 47.49 |
| | 7 | $Nb_2O_5$ | 2.38 | 10.78 |
| | 8 | $SiO_2$ | 1.48 | 17.5 |
| Substrate | N/A | Corning Gorilla Glass ® Glass Code 4318 | 1.51 | N/A |

In a further aspect of the disclosure, a method of fabricating an UV light-resistant article (e.g., UV light-resistant articles 100a, 100b and 100c) can include a step of annealing the substrate to remove or mitigate any defects associated with the processing of the dielectric stack associated with UV radiation. In some aspects, the annealing step can serve the same function as the UV light-resistant element employed in other embodiments, thus obviating the need for it in certain UV light-resistant articles. In other more preferred aspects, the annealing step can serve to augment the UV light protection afforded by the UV light-resistant element or layers. Depending on the glass or glass-ceramic composition of the substrate and thermal sensitivity of the layers employed in the dielectric stack, the annealing step can include annealing the article at an annealing temperature between about 200° C. and about 300° C. for about 1 to about 24 hours after the step of forming the dielectric stack has been completed.

Figure 7:
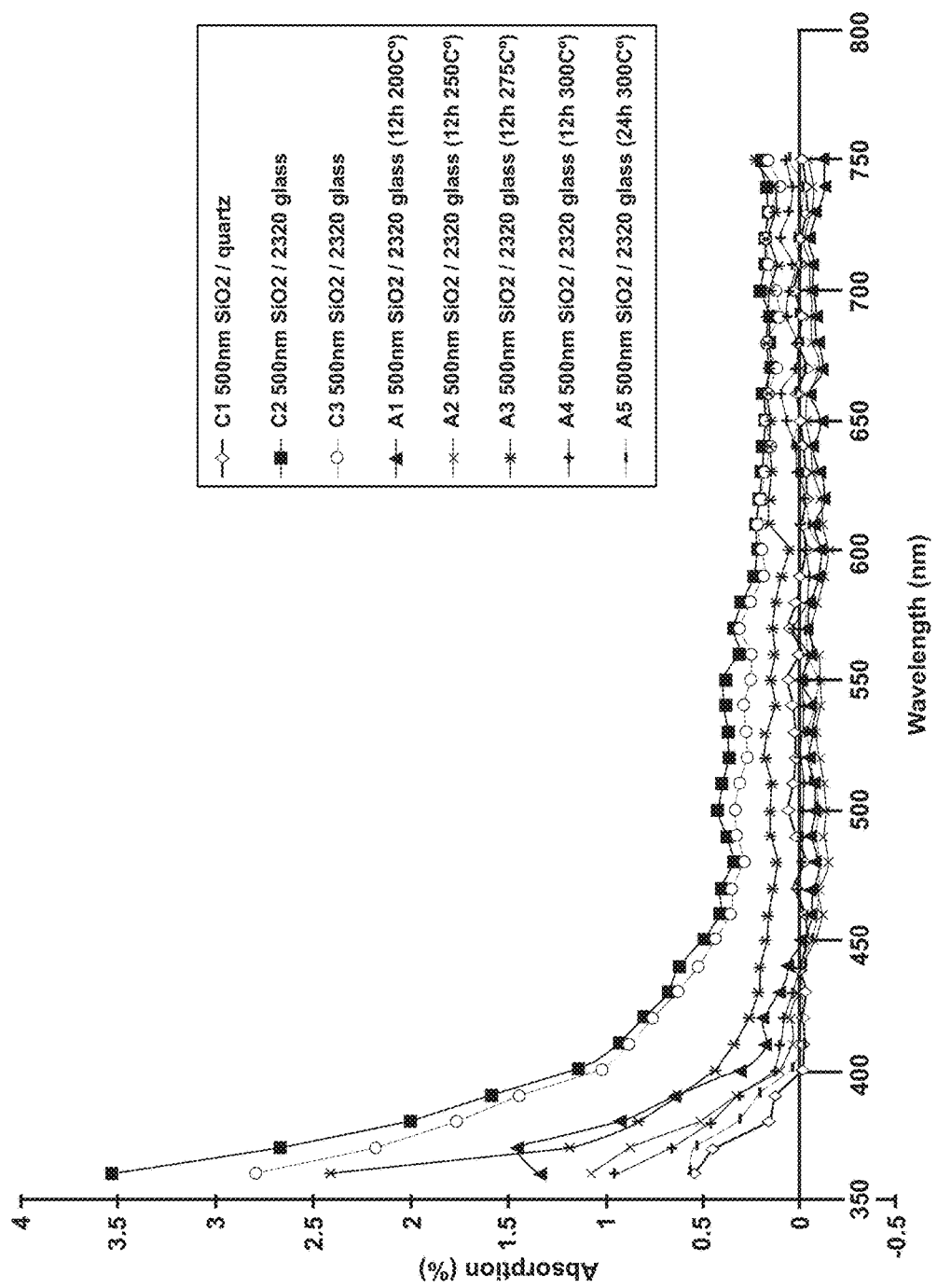
FIG. 7 is a plot of absorption as a function of wavelength for glass substrates containing a 500 nm silica film deposited with a UV-related process and varying degrees of post-deposition annealing according to an aspect of the disclosure.

For example, FIG. 7 is a plot of absorption (%) as a function of wavelength (nm) for glass substrates containing a 500 nm silica film deposited with a UV-related process and varying degrees of post-deposition annealing. In FIG. 7, the control sample designated "C1" is a quartz substrate with a 500 nm thick silica coating with a UV-assisted deposition process. As evidenced by the data, the absorption of the C1 sample is no more than 0.5%, indicative of the lack of any damage from the silica deposition process to a crystalline substrate. In contrast, the samples designated "C2" and "C3" are substrates with a Corning® Gorilla Glass® Glass Code 2320 with a 500 nm thick silica coating. Here, the damage associated with the silica deposition process is relatively high and the absorption levels approach or exceed 3% at wavelengths less than 400 nm To demonstrate the beneficial effects of annealing, samples "A1" through "A5" are substrates with a Corning® Gorilla Glass® Glass Code 2320 with a 500 nm thick silica coating that are exposed to the following annealing parameters: 12 hours at 200° C. (A1); 12 hours at 250° C. (A2); 12 hours at 275° C. (A3); 12 hours at 300° C. (A4); and 24 hours at 300° C. (A5). Based on the data in FIG. 7, it is evident that both increases to annealing time and temperature reduce the measured absorption levels in these samples, owing to reorganization and removal of defects caused by the silica deposition process involving UV radiation. For example, the A5 sample exhibits an absorption level of about 0.5% or less across the measured wavelength range, results that are very similar to the C1 control sample with a quartz substrate.

Figure 8A:
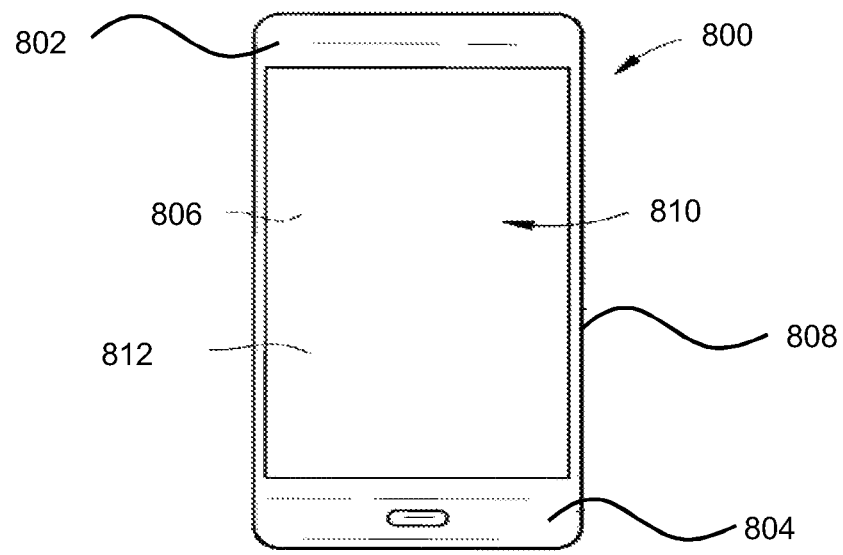
FIG. 8A is a plan view of an exemplary electronic device incorporating any of the ultraviolet light-resistant articles disclosed herein.
Figure 8B:
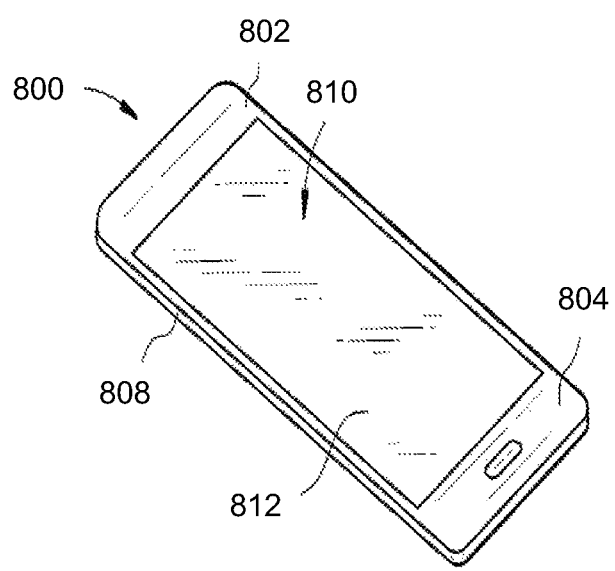
FIG. 8B is a perspective view of the exemplary electronic device of FIG. 8A.

The articles 100a-100c disclosed herein may include articles with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. A specific example of articles 100a-100c incorporated into a product is shown in FIG. 8. Specifically, FIG. 8 shows a consumer electronic device 800 including a housing 802 having front 804, back 806, and side surfaces 808; electrical components (not shown) that are at least partially inside or entirely within the housing and including at least a controller, a memory, and a display 810 at or adjacent to the front surface of the housing; and a cover substrate 812 at or over the front surface of the housing such that it is over the display. In some embodiments, the cover substrate 812 may include articles 100a-100c. In some embodiments, the housing 802 may include articles 100a-100c.

It should be emphasized that the above-described embodiments of the present invention, particularly any "preferred" embodiments, are merely possible examples of implementations, merely set forth for a clear understanding of various principles of the invention. Many variations and modifications may be made to the above-described embodiments of the invention without departing substantially from the spirit and various principles of the invention. All such modifications and variations are intended to be included herein within the scope of this disclosure and the present invention and protected by the following claims.

In a first aspect, an ultraviolet light-resistant article is provided. The article includes: a substrate comprising a glass or glass-ceramic and first and second primary surfaces; an ultraviolet light-absorbing element having an absorption greater than 50% at wavelengths from about 100 nm to about 380 nm and a thickness between about 10 nm and about 500 nm; and a dielectric layer disposed on the first primary surface. The ultraviolet light-absorbing element is between the substrate and the dielectric layer.

In a second aspect according to the first aspect, the electric layer further comprises a first and a second dielectric layer over the first primary surface and the layers are characterized by differing refractive index values.

In a third aspect according to the first or second aspect, the substrate has a glass composition comprising $SiO_2$, $Al_2O_3$ and at least two oxides selected from the group consisting of $B_2O_3$, $P_2O_5$, MgO, CaO, SrO, BaO, ZnO, $Na_2O$, $K_2O$, and $Li_2O$.

In a fourth aspect according to any one of the first through third aspects, the ultraviolet light-absorbing element has an extinction coefficient (k) of $\leq 5\times10^{-4}$ at wavelengths from about 400 nm to about 700 nm.

In a fifth aspect according to any one of the first through fourth aspects, the ultraviolet light-absorbing element has an extinction coefficient (k) of $\geq 5\times10^{-4}$ at wavelengths greater than about 200 nm.

In a sixth aspect according to any one of the first through fifth aspects, the dielectric layer comprises one or more materials having a high refractive index and an absorption less than the absorption of the ultraviolet light-absorbing element.

In a seventh aspect according to any one of the first through sixth aspects, the ultraviolet light-absorbing element comprises at least one of $AlSiO_xN_y$, $Nb_2O_5$, $Ta_2O_5$, $TiO_2$, $SnO_2$ and ZnO.

In an eighth aspect according to any one of the first through seventh aspects, the total thickness of the dielectric layer and the light-absorbing element is between about 10 nm and about 2000 nm.

In a ninth aspect according to any one of the first through eighth aspects, the article comprises a maximum hardness of 8 GPa or greater, as measured by a Berkovich Indenter Test.

In a tenth aspect according to any one of the first through ninth aspects, the ultraviolet light-absorbing element has a maximum indentation hardness, as measured by a Berkovich Indenter Test, within about ±50% of the maximum indentation hardness of the article.

In a eleventh aspect according to any one of the first through tenth aspects, the article exhibits an a* parameter color shift and a b* parameter color shift of less than about 4 upon exposure to visible light at a normal incidence angle.

In a twelfth aspect according to any one of the first through eleventh aspects, the ultraviolet light-absorbing element has an absorption of greater than 75% at wavelengths from about 100 nm to about 380 nm.

In a thirteenth aspect according to any one of the first through twelfth aspects, the ultraviolet light-absorbing element has an absorption of greater than 90% at wavelengths from about 100 nm to about 380 nm.

In a fourteenth aspect, an ultraviolet light-resistant article is provided that includes: a substrate comprising a glass or glass-ceramic and first and second primary surfaces; a dielectric layer stack disposed on the first primary surface; and at least one ultraviolet light-absorbing layer having an absorption greater than 50% at wavelengths from about 100 nm to about 380 nm and a thickness between about 10 nm and about 200 nm. The at least one light-absorbing layer is within the dielectric layer stack.

In a fifteenth aspect according to the fourteenth aspect, the dielectric layer stack comprises a first dielectric layer and a second dielectric layer, wherein the first dielectric layer and the second dielectric layer comprise differing refractive index values from one another.

In a sixteenth aspect according to the fourteenth or fifteenth aspect, the at least one ultraviolet light-absorbing layer is a single ultraviolet light-absorbing layer.

In a seventeenth aspect according to any one of the fourteenth through sixteenth aspects, the dielectric layer stack comprises an alternating sequence of dielectric layers and ultraviolet-light absorbing layers.

In an eighteenth aspect according to any one of the fourteenth through seventeenth aspects, the at least one ultraviolet light-absorbing layer has an extinction coefficient (k) of $\leq 5 \times 10^{-4}$ at wavelengths from about 380 nm to about 700 nm.

In a nineteenth aspect according to any one of the fourteenth through eighteenth aspects, the ultraviolet light-absorbing element has an extinction coefficient (k) of $\geq 5 \times 10^{-4}$ at wavelengths greater than about 700 nm.

In a twentieth aspect according to any one of the fourteenth through nineteenth aspects, the substrate has a glass composition comprising $SiO_2$, $Al_2O_3$ and at least two oxides selected from the group consisting of $B_2O_3$, $P_2O_5$, MgO, CaO, SrO, BaO, ZnO, $Na_2O$, $K_2O$, and $Li_2O$.

In a twenty-first aspect according to any one of the fourteenth through twentieth aspects, the at least one ultraviolet light-absorbing layer comprises at least one of $AlSiO_xN_y$, $Nb_2O_5$, $Ta_2O_5$, $TiO_2$, $SnO_2$ and ZnO.

In a twenty-second aspect according to any one of the fourteenth through twenty-first aspects, the total thickness of the dielectric layer stack is between about 10 nm and about 5000 nm.

In a twenty-third aspect according to one of the fourteenth through twenty-second aspects, the article has a maximum indentation hardness of 8 GPa or greater, as measured by a Berkovich Indenter Test along an indentation depth of about 50 nm or greater.

In a twenty-fourth aspect according to one of the fourteenth through twenty-third aspects, the at least one ultraviolet light-absorbing layer has a maximum indentation hardness, as measured by a Berkovich Indenter Test along an indentation depth of about 50 nm or greater, within about ±50% of the maximum indentation hardness of the article.

In a twenty-fifth aspect according to one of the fourteenth through twenty-fourth aspects, the article exhibits an a* parameter color shift and a b* parameter color shift of less than about 4 after exposure to visible light at a normal incidence angle.

In a twenty-sixth aspect according to one of the fourteenth through twenty-fifth aspects, the at least one ultraviolet light-absorbing layer has an absorption of greater than 75% at wavelengths from about 100 nm to about 380 nm.

In a twenty-seventh aspect according to one of the fourteenth through twenty-sixth aspects, the at least one ultraviolet light-absorbing light has an absorption of greater than 90% at wavelengths from about 100 nm to about 380 nm.

In a twenty-eighth aspect, a method of making an ultraviolet light-resistant article is provided. The method includes the steps: providing a substrate comprising a glass or glass-ceramic and first and second primary surfaces; forming at least one ultraviolet light-absorbing layer over a first primary surface, the light-absorbing layer having an absorption of about 50% or greater at wavelengths from about 100 nm to about 380 nm and a thickness between about 10 nm and about 500 nm; and forming a dielectric layer with a plasma-assisted deposition process. The light-absorbing layer is configured to inhibit damage to the first primary surface of the substrate from the step of forming the dielectric layer.

In a twenty-ninth aspect according to the twenty-eighth aspect, forming a dielectric layer comprises forming an alternating sequence of first and second dielectric layers over the first primary surface, the first and second dielectric layers characterized by differing refractive index values.

In a thirtieth aspect according to the twenty-eighth or twenty-ninth aspect, forming at least one ultraviolet light-absorbing layer and a dielectric layer are conducted such that the at least one light-absorbing layer is a single ultraviolet light-absorbing layer formed on the first primary surface and the dielectric layer is formed over the light-absorbing layer.

In a thirty-first aspect according to any one of the twenty-eighth through thirtieth aspects, forming at least one ultraviolet light-absorbing layer and a dielectric layer are conducted such that the at least one light-absorbing layer is a single ultraviolet light-absorbing layer formed within the dielectric layer.

In a thirty-second aspect according to any one of the twenty-eighth through thirty-first aspects, forming a dielectric layer and at least one ultraviolet light-absorbing layer are performed at substantially the same time to form an alternating sequence of dielectric and ultraviolet light-absorbing layers.

In a thirty-third aspect according to any one of the twenty-eighth through thirty-second aspects, forming an ultraviolet light-absorbing layer and a dielectric layer are both conducted in a single deposition chamber.

In a thirty-fourth aspect according to of the twenty-eighth through thirty-third aspects, the substrate comprises a glass having a composition comprising $SiO_2$, $Al_2O_3$ and at least two oxides selected from the group consisting of $B_2O_3$, $P_2O_5$, MgO, CaO, SrO, BaO, ZnO, $Na_2O$, $K_2O$, and $Li_2O$.

In a thirty-fifth aspect according to of the twenty-eighth through thirty-fourth aspects, the ultraviolet light-absorbing layer comprises at least one of $AlSiO_xN_y$, $Nb_2O_5$, $Ta_2O_5$, $TiO_2$, $SnO_2$ and ZnO.

In a thirty-sixth aspect according to of the twenty-eighth through thirty-fifth aspects, the substrate exhibits an a* parameter color shift and a b* parameter color shift of less than about 4 upon exposure to visible light at a normal incidence angle after the step of forming the ultraviolet light-absorbing layer.

In a thirty-seventh aspect according to of the twenty-eighth through thirty-sixth aspects, forming the ultraviolet light-absorbing layer and the dielectric layer are conducted such that the light-absorbing layer is formed within the dielectric layer.

In a thirty-eighth aspect according to of the twenty-eighth through thirty-seventh aspects, the method further comprises annealing the substrate at a temperature between about 200° C. and about 300° C. for about 1 to about 24 hours after forming the dielectric layer.

In a thirty-ninth aspect, a device is provided. The device includes: a housing having a front surface, a back surface and side surfaces; electrical components provided at least partially inside the housing; a display at or adjacent the front surface of the housing; and a cover substrate disposed over the display, wherein the cover substrate comprises the article according to any one of the first through twenty-seventh aspects.

We claim:

1. An ultraviolet light-resistant article, comprising:
a substrate comprising a glass or glass-ceramic and first and second primary surfaces;
an ultraviolet light-absorbing element having an absorption greater than 50% at wavelengths from about 250 nm to about 380 nm and a thickness between about 10 nm and about 500 nm; and
a dielectric layer comprising a first and a second dielectric sublayer disposed over the first primary surface, wherein the ultraviolet light-absorbing element is between the substrate and the dielectric layer, wherein the ultraviolet light-absorbing element comprises a refractive index higher than a refractive index of the first and the second dielectric sublayers, wherein the first and second dielectric sublayers are characterized by differing refractive index values, and further wherein the ultraviolet light-absorbing element comprises an absorption greater than an absorption of the first and the second dielectric sublayers.

2. The article according to claim 1, wherein the substrate has a glass composition comprising $SiO_2$, $Al_2O_3$ and at least two oxides selected from the group consisting of $B_2O_3$, $P_2O_5$, MgO, CaO, SrO, BaO, ZnO, $Na_2O$, $K_2O$, and $Li_2O$.

3. The article according to claim 1, wherein the ultraviolet light-absorbing element has an extinction coefficient (k) of $\leq 5\times10^{-4}$ at wavelengths from about 400 nm to about 700 nm.

4. The article according to claim 1, wherein the ultraviolet light-absorbing element has an extinction coefficient (k) of $\geq 5\times10^{-4}$ at wavelengths greater than about 200 nm.

5. The article according to claim 1, wherein the ultraviolet light-absorbing element comprises at least one of $AlSiO_xN_y$, $Nb_2O_5$, $Ta_2O_5$, $TiO_2$, $SnO_2$ and ZnO.

6. The article according to claim 1, wherein the total thickness of the dielectric layer and the light-absorbing element is between about 10 nm and about 2000 nm.

7. The article according to claim 1, wherein the article comprises a maximum hardness of 8 GPa or greater, as measured by the Berkovich Indenter Hardness Test.

8. The article according to claim 7, wherein the ultraviolet light-absorbing element has a maximum indentation hardness, as measured by the Berkovich Indenter Hardness Test, within about ±50% of the maximum indentation hardness of the article.

9. The article according to claim 1, wherein the article exhibits an a* parameter color shift and a b* parameter color shift of less than about 4 upon exposure to visible light at a normal incidence angle.

10. The article according to claim 1, wherein the ultraviolet light-absorbing element has an absorption of greater than 75% at wavelengths from about 100 nm to about 380 nm.

11. The article according to claim 1, wherein the ultraviolet light-absorbing element has an absorption of greater than 90% at wavelengths from about 100 nm to about 380 nm.

12. A device comprising:
a housing having a front surface, a back surface and side surfaces;
electrical components provided at least partially inside the housing;
a display at or adjacent the front surface of the housing; and
a cover substrate disposed over the display, wherein the cover substrate comprises the article of claim 1.

13. The article according to claim 1, wherein the ultraviolet light-absorbing element comprises $Nb_2O_5$, the first dielectric sublayer comprises $SiO_2$ and the second dielectric sublayer comprises an oxynitride.

* * * * *

UNITED STATES PATENT AND TRADEMARK OFFICE
CERTIFICATE OF CORRECTION

PATENT NO. : 10,548,234 B2
APPLICATION NO. : 15/297329
DATED : January 28, 2020
INVENTOR(S) : Kaveh Adib et al.

Page 1 of 1

It is certified that error appears in the above-identified patent and that said Letters Patent is hereby corrected as shown below:

On the Title Page

In Column 1, item (57), Abstract, Line 4, delete "a an" and insert -- an --, therefor.

On page 2, in Column 2, item (56), Other Publications, Line 18, delete "land" and insert -- 1 and --, therefor.

In the Claims

In Column 19, Line 25 (approx.), Claim 3, delete "of≤5" and insert -- of $\leq 5$ --, therefor.

In Column 19, Line 30 (approx.), Claim 4, delete "of≥5" and insert -- of $\geq 5$ --, therefor.

Signed and Sealed this
Thirty-first Day of March, 2020

Andrei Iancu
*Director of the United States Patent and Trademark Office*